United States Patent
Sigl et al.

(10) Patent No.: US 6,633,485 B1
(45) Date of Patent: Oct. 14, 2003

(54) SNAP-IN HEAT SINK FOR SEMICONDUCTOR MOUNTING

(75) Inventors: Dennis R. Sigl, Greenville, WI (US); Richard Mark Achtner, Neenah, WI (US)

(73) Assignee: Illinois Tool Works Inc., Glenview, IL (US)

(*) Notice: Subject to any disclaimer, the term of this patent is extended or adjusted under 35 U.S.C. 154(b) by 0 days.

(21) Appl. No.: 10/065,794

(22) Filed: Nov. 20, 2002

(51) Int. Cl.[7] .................................................. H05K 7/20
(52) U.S. Cl. ..................... 361/718; 29/890.03; 257/727; 361/704
(58) Field of Search ................................ 165/80.3, 185; 248/27.1, 505, 510; 167/150, 158, 160; 361/703–705, 709–712, 715, 717–719, 722; 257/706, 707, 713, 718, 719, 722, 726, 727; 174/16.3; 29/890.03

(56) References Cited

U.S. PATENT DOCUMENTS

| | | |
|---|---|---|
| 4,012,769 A | 3/1977 | Edwards et al. |
| 4,054,901 A | 10/1977 | Edwards et al. |
| 4,187,711 A | 2/1980 | Lavochkin et al. |
| 4,203,488 A | 5/1980 | Johnson et al. |
| 4,215,361 A | 7/1980 | McCarthy |
| 4,235,285 A | 11/1980 | Johnson et al. |
| 4,261,005 A | 4/1981 | McCarthy |
| 4,261,076 A | 4/1981 | Clemens |
| D260,388 S | 8/1981 | Kennington |
| D260,761 S | 9/1981 | Kennington |
| D261,354 S | 10/1981 | Clemens |
| D262,203 S | 12/1981 | Johnson et al. |
| 4,304,514 A | 12/1981 | Pfaff |
| D262,960 S | 2/1982 | Johnson et al. |
| D262,961 S | 2/1982 | McCarthy |
| D263,042 S | 2/1982 | McCarthy |
| 4,321,423 A | 3/1982 | Johnson et al. |
| D264,964 S | 6/1982 | Hinshaw |
| D265,987 S | 8/1982 | McCarthy |
| D267,942 S | 2/1983 | McCarthy |
| D268,666 S | 4/1983 | Moore |
| D268,667 S | 4/1983 | Jordan et al. |
| D268,833 S | 5/1983 | McCarthy |
| D269,084 S | 5/1983 | McCarthy |
| 4,388,967 A | 6/1983 | Breese |
| D269,606 S | 7/1983 | Jordan et al. |
| 4,403,102 A | 9/1983 | Jordan et al. |
| D272,902 S | 3/1984 | Johnson et al. |
| D273,006 S | 3/1984 | McCarthy |
| 4,446,504 A | 5/1984 | Jordan et al. |
| D275,388 S | 9/1984 | McCarthy |
| D275,648 S | 9/1984 | McCarthy |
| D275,666 S | 9/1984 | McCarthy |
| 4,471,837 A | 9/1984 | Larson |
| D275,749 S | 10/1984 | McCarthy |
| D277,748 S | 2/1985 | McCarthy |

(List continued on next page.)

Primary Examiner—Gerald Tolin
(74) Attorney, Agent, or Firm—Ziolkowski Patent Solutions Group, LLC

(57) ABSTRACT

A snap-in heat sink assembly that has an injection molded one piece frame having a plurality of spring members extending outwardly with protrusions at the free ends thereof. The assembly has a spring located against the frame and an electronic component is located atop of the spring. A heat sink has lateral surfaces with elongated grooves formed along those lateral surfaces. The sink is affixed to the frame by a simple step of inserting the heat sink into the space between the spring members such that the protrusions of the spring members snap into the grooves when the heat sink is in the desired location. By sandwiching the spring between the frame and the electronic component, the spring creates a bias to force the electronic component against the heat sink to assure good conductivity of heat from the electronic component through the heat sink.

21 Claims, 7 Drawing Sheets

U.S. PATENT DOCUMENTS

| | | |
|---|---|---|
| 4,508,163 A | 4/1985 | McCarthy |
| D280,319 S | 8/1985 | McCarthy |
| D280,320 S | 8/1985 | McCarthy |
| D280,811 S | 10/1985 | Moore |
| 4,544,942 A | 10/1985 | McCarthy |
| 4,552,206 A | 11/1985 | Johnson et al. |
| D282,838 S | 3/1986 | McCarthy |
| 4,575,038 A | 3/1986 | Moore |
| 4,588,028 A | 5/1986 | Marshall et al. |
| D284,851 S | 7/1986 | Moore |
| 4,602,315 A | 7/1986 | Breese |
| D285,193 S | 8/1986 | Moore |
| 4,609,040 A | 9/1986 | Moore |
| 4,625,260 A | 11/1986 | Jordan et al. |
| 5,699,229 A * | 12/1997 | Brownell .................... 361/719 |
| 6,229,706 B1 * | 5/2001 | Cook et al. ................. 361/719 |

* cited by examiner

SNAP-IN HEAT SINK FOR SEMICONDUCTOR MOUNTING

BACKGROUND OF INVENTION

The present invention relates to a heat sink for use with an electronic component, and, more particularly, to an assembly of an electronic component and a heat sink that can be readily manufactured and assembled.

There are, of course, many types and construction of heat sinks that are used to conduct heat away from electronic components. The heat sinks are normally provided in the form of heat sink assemblies that combine the heat sink itself with the heat generating electronic component. The main purpose of the heat sink assembly is to locate, secure and protect all of the heat sinks in a particular machine. As examples, all welding power sources have heat generating electronic components, and some of those components require an additional means of dissipating the heat produced. Thus, with such electronic components, heat sinks are used to dissipate that heat and such electronic components can include diodes, IGBTs, resistors or any other of the electronic components used in various differing type of apparatus.

With present electronic components used in welding apparatus, the heat generating electronic component can be assembled individually into a standard package or can be assembled into a module type of package that may house a plurality of the electronic components and either the single mounting or module type of mounting can be obtained commercially. However, with the individual package, while the cost is relatively inexpensive to the user, there is a need to purchase many of the devices to assemble a welding power source and the sheer number of individual devices make it very difficult to assemble the overall power source with the traditional types of assembly methods. On the other hand, with the modular package, the assembly of the multiple electronic component is simplified since there are less devices to assembly, however the module form of heat sink assembly is more expensive than the purchase of many individual devices.

As such, there is also a need to make the manufacturability of the heat sink devices to be as inexpensive as possible and to use mass production techniques in the assembly of the heat sink to the electronic component. Traditionally, one means of attaching the heat generating electronic component to the heat sink is by means of a threaded mounting, such as screws, and then the heat sink and the device assembly is mounted to the frame of the power source with additional screws or other mounting means. If there are a large number of such devices, the assembly can become considerably time consuming and difficult to assemble with conventional methods.

Also, with the use of threaded devices, there may also be a need for a lock washer, drilling and tapping of the heat sink and all of such operations and additional mounting hardware contributes to the cost of the manufacture. The screws used to attach the heat sink must also be torqued down precisely. If the screws are torqued too loosely, there is not sufficient heat conducting contact between the electronic component and the heat sink. On the other hand, if the torquing is too tight, there may be breakage or damage to the device.

In other heat sink assemblies, spring clips have been used to attach the heat sink to a frame having the electronic component in contact with the heat sink.

BRIEF DESCRIPTION OF INVENTION

Accordingly, the present invention relates to an assembly for affixing a heat sink in a good heat conducting position to an electronic component that is readily manufacturable and assembled with mass production techniques. With the present invention, the need for mounting hardware is eliminated as is the requirement that there be any additional modifications made to the heat sink to mate it to the electronic component in a good heat conducting relationship. In addition, the present heat sink assemblies of this invention can be made in large quantity, mass produced modules easily and inexpensively and are adapted to be manufactured as various individual assemblies or module type of assemblies with multiple heat sinks.

Thus, the heat sink assembly of the present invention comprises a frame that has a bottom surface that is generally a flat surface and which has a plurality of guides that extend upwardly from the flat surface. As will be seen, therefore, there are preferably four guides that combine to form the corners of a rectangle and are dimensioned so that a rectangular electronic component can be placed in the space between the guides and moved toward the bottom surface of the frame and the inwardly narrowing space serves to accurately position the electronic component as it reaches the bottom surface. The frame also has a plurality of spring members that also extend outwardly from the bottom surface of the frame in the same direction as the guides and the spring members have a inwardly facing projections at the free ends thereof. Another preferred feature of the frame is that there may be a plurality of spring guides, also preferably molded into the frame and which project outwardly from the bottom surface to position a spring with respect to the frame as will later be explained. Also the frame may have an indexing protrusion extending outwardly from the bottom surface that interfits with the electronic component to guide that electronic component in the desired position in the heat sink when assembled and again, will be later explained.

As can be seen, all of the aforementioned features can be injection molded into a one piece construction and therefore can be produced relatively inexpensively in large quantities.

A spring is positioned on the bottom surface of the frame and within the space between the guides. The spring can be a generally central outwardly arched shape with the ends of the spring guided into the desired position against the bottom surface of the frame by means of the spring guides such that the spring can be easily and rapidly inserted into the proper position and be assured of being correctly located. The spring itself is preferably constructed of a metal material.

The electronic component is positioned atop of the spring in contact therewith and the electronic component preferably has an aperture that receives the indexing protrusion so that the electronic component can be inserted into the space between the guides where the indexing protrusion enters the aperture and guides the electronic component into its proper position.

Finally, there is a heat sink that is affixed to the frame in accordance with the present invention. The heat sink is basically a metal block having a generally planar surface and having a plurality of heat radiating fins that extend outwardly. In one preferred embodiment, the heat sink is extruded of aluminum and has two lateral exterior surfaces with the heat radiating fins being elongated in the same orientation as the lateral exterior surfaces as would be a result of the extrusion process. Each of the lateral exterior surfaces has an elongated ridge formed thereabout and which runs the entire length of each lateral exterior surface.

The heat sink is affixed to the frame by means of the interfitting of the inward projections at the free ends of the spring members that snap fit into the ridges formed about the lateral exterior sides of the heat sink and the location of the grooves and the designed length of the spring members is, of course, predetermined so that the heat sink is positioned at a desired location affixed to the frame and the planar surface of the heat sink is fully abutted against the surface of the electronic component so that the heat from the heat generating electronic component can be efficiently transferred to and dissipated through the heat sink. The heat sink is also guided in its seating within the frame as the heat sink enters the space between the guides.

The electronic component is forced or biased against the planar surface of the heat sink by means of the spring that is sandwiched between the bottom surface of the frame and the lower surface of the electronic component automatically creating the desired force of the electronic component against the heat sink.

As such, the present heat sink assembly is easily assembled and the force of the electronic component that holds it against the heat sink is predetermined and a known force is automatically established for good heat conductivity with no need for an assembler to take any action to set or adjust that force. The assembly of the present heat sink assembly is carried out by a simple one-step operation and therefore is conducive to mass production techniques that are relatively inexpensive and no additional physical alteration, such as drilling, tapping or the like of the heat sink is required that could add to the overall time to construct the heat sink assembly.

These and other features and advantages of the present invention will become more readily apparent during the following detailed description taken in conjunction with the drawings herein.

DETAILED DESCRIPTION

Figure 1:
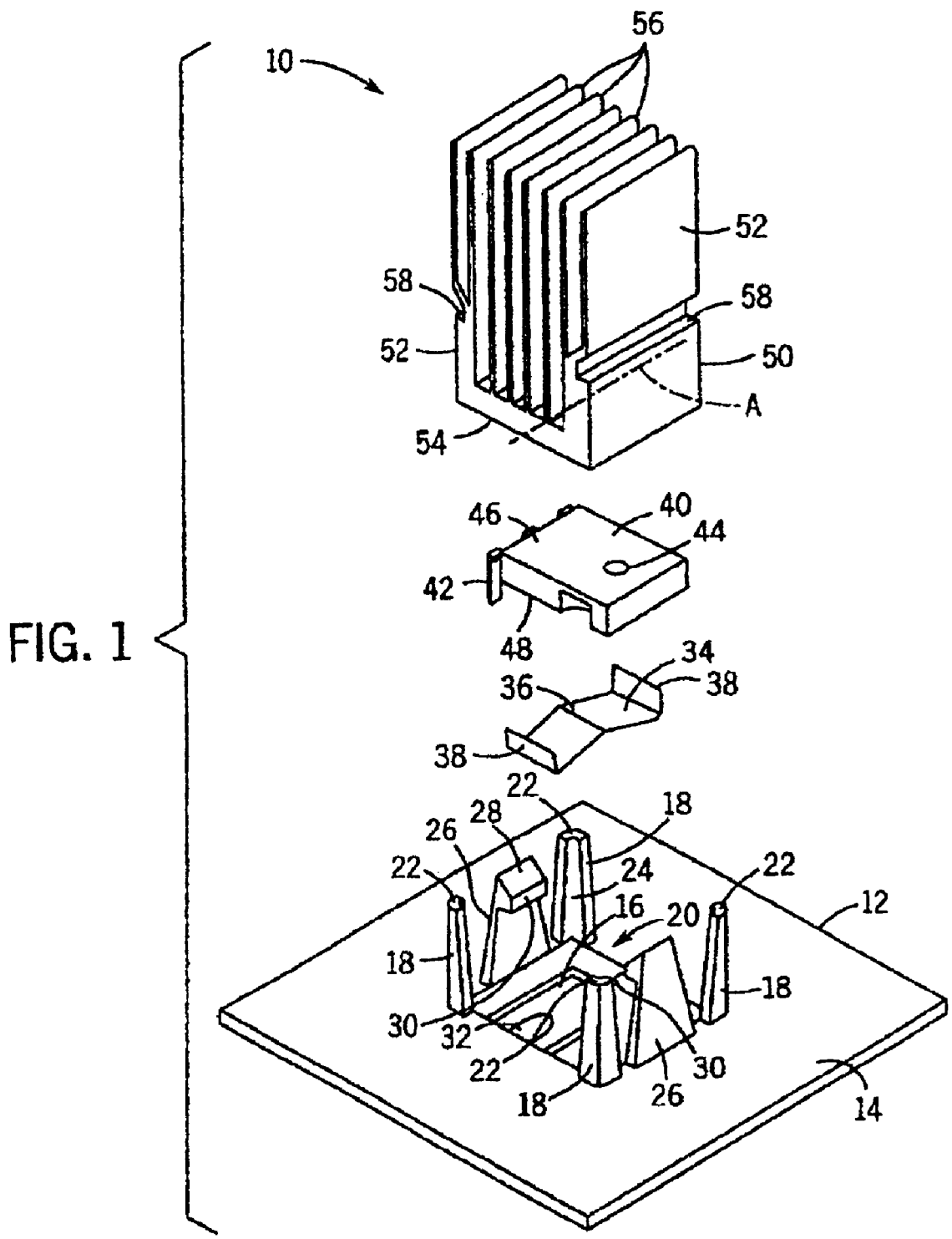
FIG. 1 is an exploded view of a heat sink assembly constructed in accordance with the present invention.

Referring now to FIG. 1, there is shown an exploded view of the heat sink assembly 10 constructed in accordance with the present invention. As can be seen, the heat sink assembly 10 includes a frame 12 having a generally planar upper surface 14 and having downwardly displaced bottom surface 16 that is formed in the frame 12. Surrounding the bottom surface 16 are a plurality of guides 18 that extend outwardly with respect to the bottom surface 16. The guides 18 are shown as extending outwardly from the upper surface 14, however, the guides 18 may also extend outwardly directly from the bottom surface 16, it only being of importance that the guides extend outwardly with respect to the bottom surface 16.

In the preferred embodiment of FIG. 1, there are four guides 18 and which define a space 20 therebetween with the guides 18 being located at each corner of a rectangular space 20. Each of the guides 18 is preferably shaped so as to have free ends 22 and an inner surface 24 that is tapered inwardly in the direction toward the bottom surface 16, that is, the rectangular space 20 narrows in the direction towards the bottom surface 16 so that a rectangular object placed into the space 20 will pass along a narrowing space 20 and be fully guided to its ultimate location at the inner ends of the guides 18.

Also extending outwardly with respect to the bottom surface 16 are a plurality of spring members 26 that are configured so as to have a generally downwardly and inwardly sloping free end 28 leading to an inwardly directed projections 30 formed therein. Again, as shown in the preferred embodiment of FIG. 1, there are two of such spring members 26. However, more spring members could be used as the width of the heat sink increases. There are also a plurality of holes 32 formed in the bottom surface 16 and the purpose and use of such holes 32 will later become apparent.

Accordingly, the frame 12 includes a number of features, and may also include an indexing protrusion (not shown in FIG. 1) that extends outwardly from the bottom surface 16 as well as various spring guides (not shown in FIG. 1) that are also formed in the bottom surface 16. A preferred plastic material that can be used for the injection molded frame 12 is highly ordered syndiotactic molecular structure based on the polystyrene monomer and marketed under the name Questra 533. Other fabricating materials may also be used.

A spring 34 is provided and has a generally upwardly curved or arched upper surface 36 and has upturned outer ends 38. The spring 34 is preferably constructed of a metal, such as stainless steel, and has dimensions and configuration designed so as to provide a predetermined upward springing action when the upper surface 36 is compressed. In the assembly of the present heat sink assembly 10, the spring 34 is placed onto the bottom surface 16 of the frame 12 and is guided into the desired position on that bottom surface 16 by means of the spring guides (not shown in FIG. 1).

As a further component of the heat sink assembly 10 there is an electronic component 40 and which may be any of a number of typical heat generating electronic devices such as diodes, IGBTs, resistors and the like. The electronic component 40 has a plurality of conductive leads 42 that extend outwardly and downwardly toward the frame 12.

As can be seen, the conductive leads 42 extend through the holes 32 when the electronic component 40 is mounted to the bottom surface 16 of the frame and the conductive leads 42 can be wave soldered to a circuit board located on the downward side of the frame 12 as seen in FIG. 1. Preferably the electronic component 40 also has an opening 44 that mates with the indexing protrusion (not shown in FIG. 1) formed in the bottom surface 16 of the frame 12 to guide the electronic component into the desired location within the frame 12. The electronic component 40 has a flat upper surface 46 and a lower surface 48.

Finally a heat sink 50 is provided and which is preferably formed of a metal and, in the preferred embodiment, is extruded of aluminum. The heat sink 50 has lateral external surfaces 52, oppositely disposed, a lower planar surface 54 and a plurality of heat radiating fins 56. As can be seen the heat radiating fins 56 are elongated or oriented along an axis identified along the centerline A which is basically determined by the extrusion process itself and the external lateral surfaces 52 are generally elongated along that same orientation. An elongated groove or ridge 58 is formed along that same orientation in each of the external lateral surfaces 52. The elongated grooves 58 are formed along the entire length of each of the lateral external sides 52.

With the foregoing, the basic method of assembly of the heat sink assembly 10 can now be described. Initially the frame 12 is secured to a PC board. The spring 34 is then placed into the frame 12 to rest upon the bottom surface 14 of the frame 12 aided in its location by the use of spring guides (not shown in FIG. 1). The electronic component 40 is then placed upon the upper surface 36 of the spring 34 guided by the indexing protrusion (not shown in FIG. 1) that enters into the opening 44 in the electronic component 40 to align and position the electronic component 40 in the desired location.

The heat sink 50 is then inserted into the space 20 between the guides 18 and is progressed downwardly until the lower planar surface 54 of the heat sink 50 seats on the upper surface 46 of the electronic component 40 so that there is good heat conductivity therebetween. A silicone based thermal grease is applied to upper surface 46 and heat sink 50 to effect more efficient heat transfer. As the heat sink SO continues to move downwardly, the spring 34 is compressed and exerts a force against the lower surface 48 of the electronic component 40 to cause the electronic component 40 to more forceful contact the heat sink 50.

At the culmination of the predetermined downward movement of the heat sink 50, the inwardly directed projections 30 of the spring members 26 enter and snap fit into the elongated grooves 58 to secure the heat sink 50 in position locked to the frame 12, thus completing the assembly of the heat sink assembly 10.

Figure 2:
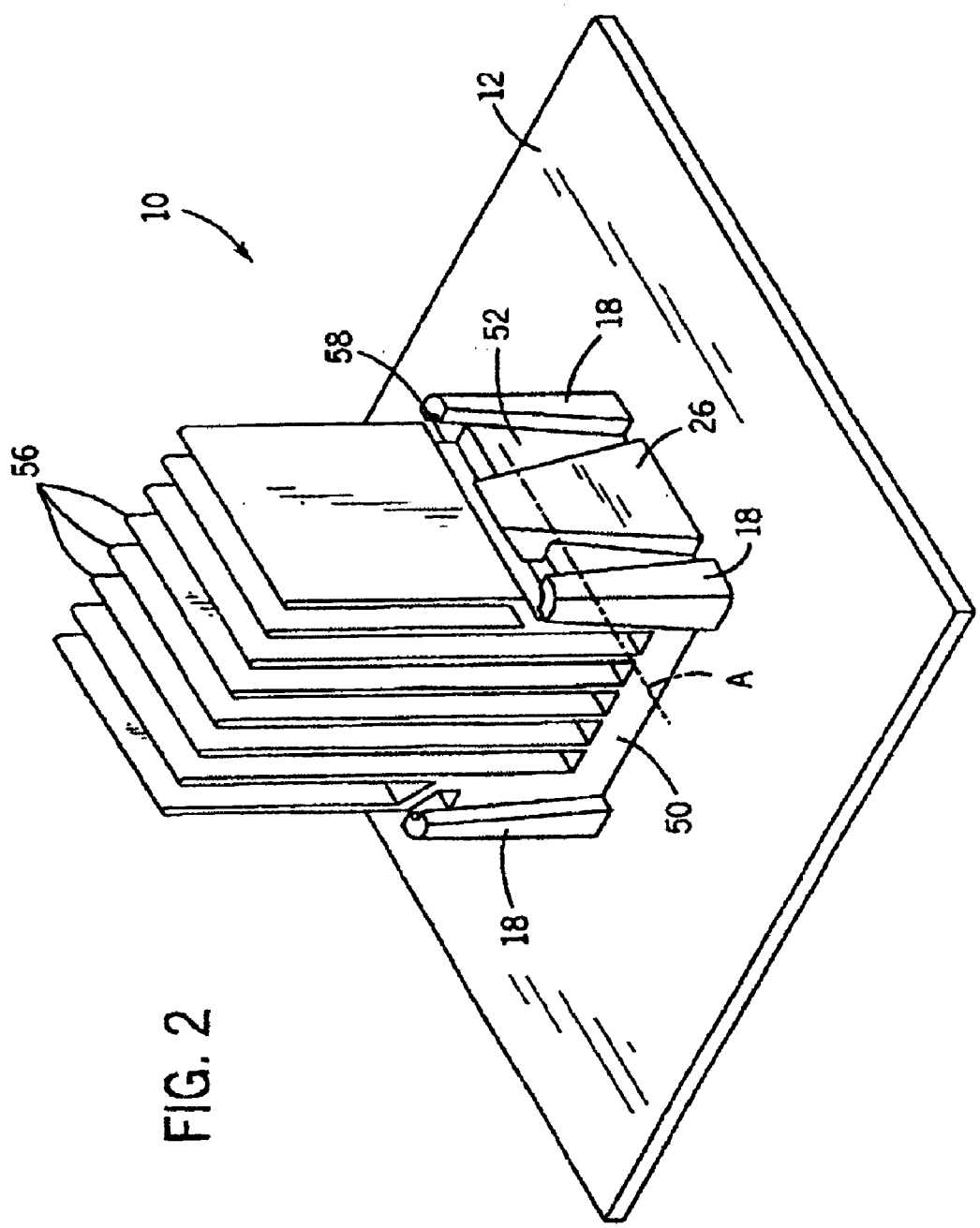
FIG. 2 is a perspective view of heat sink assembly of the present invention.

Turning now to FIG. 2, there is shown a perspective view of the heat sink assembly 10 of the present invention with the heat sink 50 affixed to the frame 12 and, as can be seen, the heat sink 50 has become centered within the guides 18 so that it is fitted into the correct position atop of the frame 12. In the assembled status as shown in FIG. 2, the spring member 26 has become snap fitted into the elongated groove 58 due to the relative flexible nature of the spring member 26 so that the heat sink 50 is tightly held to the frame 12. As also can be see, the heat radiating fins 56 are all aligned along the center line A in a generally parallel relationship and which is due to the extrusion process used to manufacture the heat sink 50.

The extrusion process makes the manufacturing of the heat sink 50 relatively easy and cost effective and the process also allows considerable flexibility in the ability to manufacture heat sinks of differing sizes, that is, once extruded into long lengths, the individual heat sink is simply cut from the extruded material according to the desired length of any particular heat sink. Accordingly, to manufacture heat sinks of at different size, the cut can be relocated by the manufacturer to whatever length of the lateral external surfaces 52 is desired, it also being seen that the elongated groove 58 will already be formed in the extrusion and thus, the heat sink to be produced only needs to be cut to the size desired and burred. No other physical alterations are needed to the heat sink.

Figure 3:
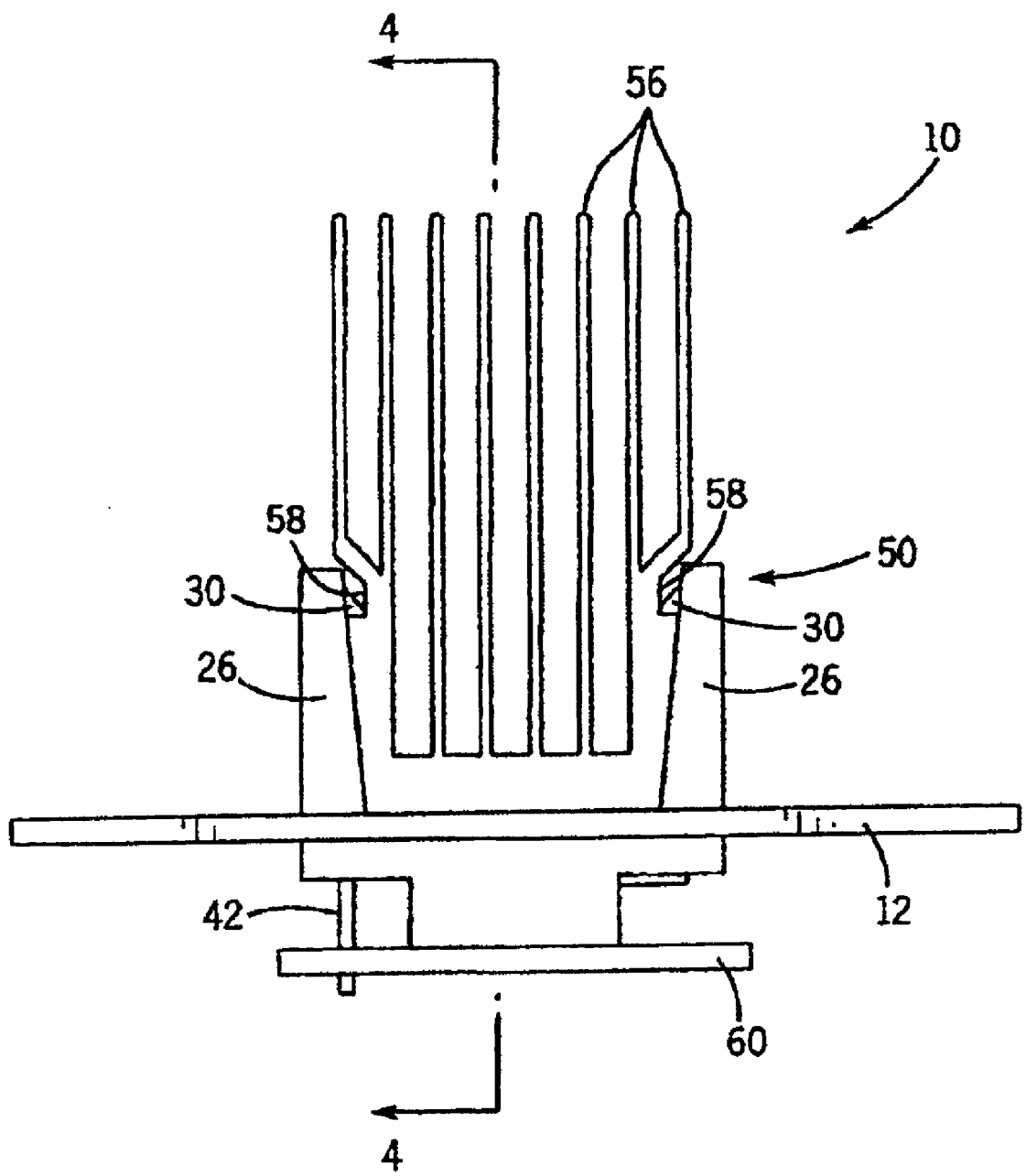
FIG. 3 is a side view of the heat sink assembly of FIG. 1.

Turning now to FIG. 3, there is shown a side view of the heat sink assembly 10, that is, taken along the extruded direction. In FIG. 3, the frame 12 is affixed to a PC board 60 and the conductive leads 42 extend downwardly to be connected to the PC board 60 by means such as wave soldering. FIG. 3 also illustrates the interconnection of the inwardly directed projections 30 formed at the free ends of the spring members 26 interfitting into the elongated grooves 58 to hold the heat sink 50 fast to the frame 12.

Figure 4:
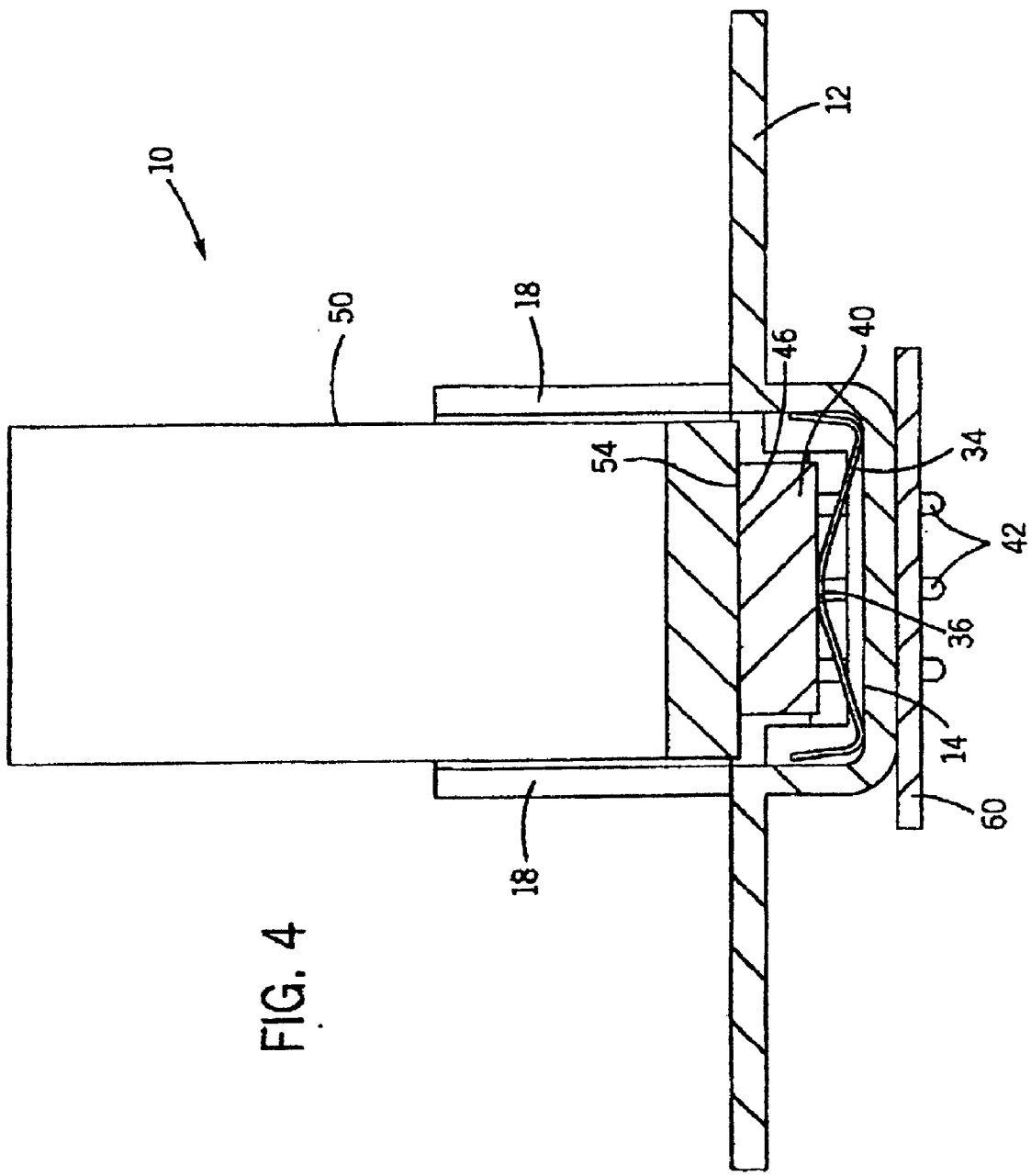
FIG. 4 is cross sectional view of the heat sink assembly taken along the lines 4—4 of FIG. 3.

Turning now to FIG. 4, there is shown a cross sectional view of the heat sink assembly 10 taken along the line 4—4 of FIG. 3. Again, as shown, the heat sink 50 is in its assembled position within guides 18 with the electronic component 40 beneath the heat sink 50 with its upper surface 46 held tightly against the lower planar surface 54 of the heat sink 50 in a good heat transfer relationship. The electronic component 40 is forced against the lower planar surface 54 by means of spring 34 that has its arched upper surface 36 exerting a force against the lower surface 48 of the electronic component 40. As such, since the heat sink 50 has been snapped into the position shown, by design of the spring 34, the amount of force to create the good heat conducting relationship between the electronic component 40 and the heat sink 50 can be predetermined and there is no need during the assembly process to make any adjustment or modify the force that forces the electronic component 40 and the heat sink 50 together.

Again the PC board 60 is also illustrated and can be simply affixed. to the bottom of the frame 12 by means of screws (not shown) that pass through holes in the PC board 60 to thread into holes created in the frame 12 during the injection molding process.

Figure 5:
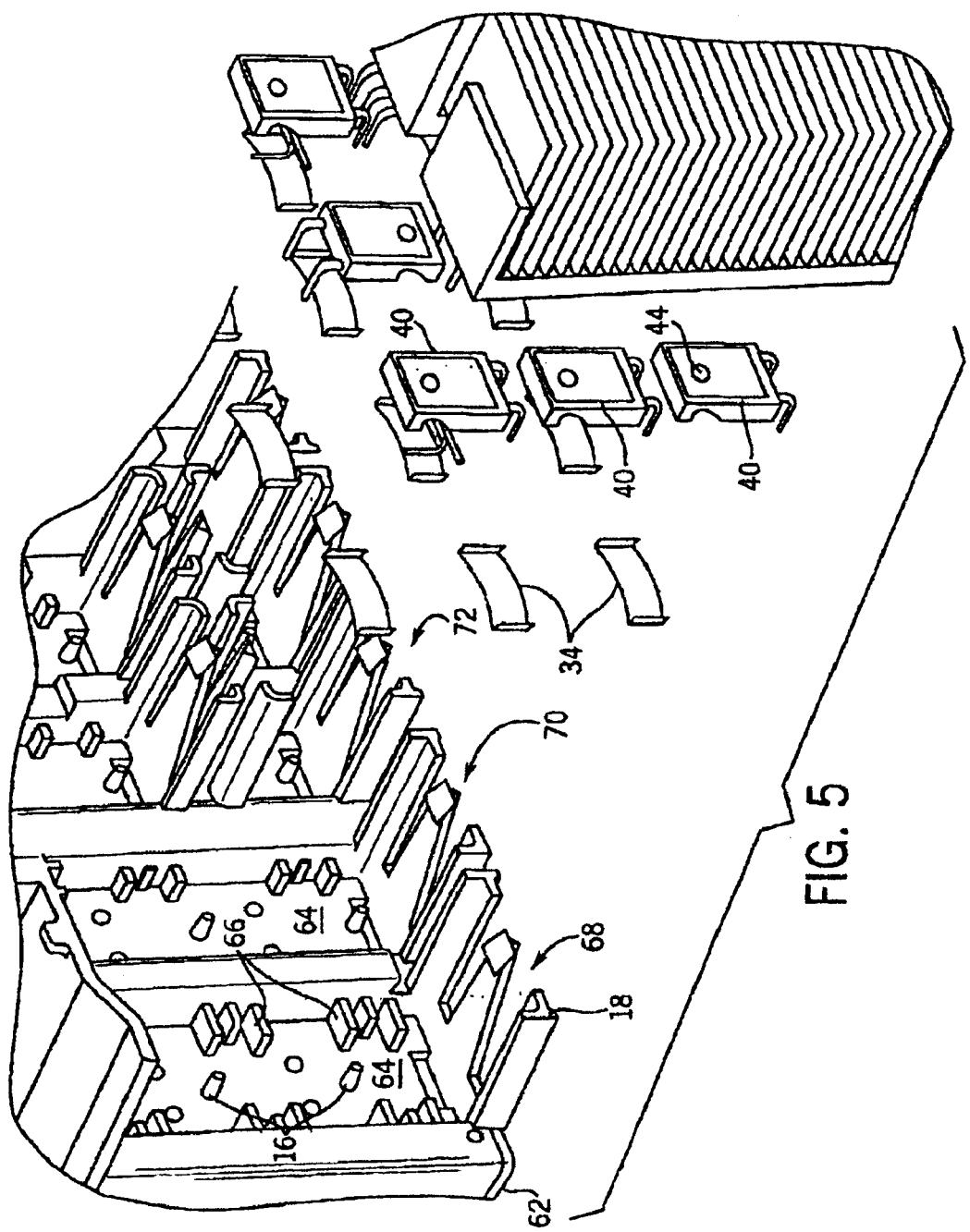
FIG. 5 is an exploded view of a plurality of heat sink assemblies utilizing the present invention.

Turning finally to FIG. 5, there is shown an exploded view showing the use of multiple heat sink assemblies 10 utilizing the present invention. In FIG. 5, there can be seen an injection molded plastic multiple frame 62 having a plurality of individual sites 64 where an electronic component 40 can be assembled to the multiple frame 62. Accordingly, each site 64 has a localized bottom surface 16 such that there are a plurality of bottom surfaces 16 at the individual localized sites 64 formed in the multiple frame 62, each site 64 intended to receive an electronic component 40 in the manner previously described and, of course, for each mounting of an electronic component 40 there are corresponding guides 18 forming spaces 20 between the guides 18 for mounting those electronic components 40 at each of the individual sites 64.

In FIG. 5, there can also be seen the indexing protrusions 66 that extend outwardly from each of the bottom surfaces 16 of the individual sites 64 of the multiple frame 62 and which enter the openings 44 in the electronic components 40 in order to properly and quickly align the electronic components 40 into the desired site 64 within the multiple frame 62 during the assembly process. In addition there are spring guides 66 that also extend outwardly from the bottom surfaces 16 of each of the sites 64 formed within the multiple frame 62 to enable the assembly of the springs 34 easily and to insure that the springs 34 are correctly positioned in each of the desired sites 64 within the multiple frame 62.

With the use of a multiple frame 62, there are formed rows 68, 70, 72 of inwardly displaced bottom surfaces 16 so that the electronic components 40 can be assembled in the rows 68, 70, 72 to mount a plurality of electronic components inexpensively and conveniently for a specific installation. In addition, as can be seen, the individual sites 64 for the electronic components 40 can be staggered horizontally along the vertical rows 68, 70, 72 so that the individual electronic components 40 can be staggered with respect to an electronic component in any adjacent row, that is, the sites 64 to receive the electronic components 40 in row 68 are displaced away from adjacent spaces in row 70 and the same is true between the rows 70 and 72.

In such manner, the staggering of the individual sites 64 of adjacent electronic components 40 can insure that electrically hot heat sinks 50 are not adjacent to each other but can be physically separated to the extent necessary to prevent electrical problems. Also, the staggered spacing of the heat sinks 50 allows more efficient use of the cooling air that passes across the rows of heat sinks 50 since the air can pass in between the heat sinks 50 more easily and with better flow distribution.

Figure 6:
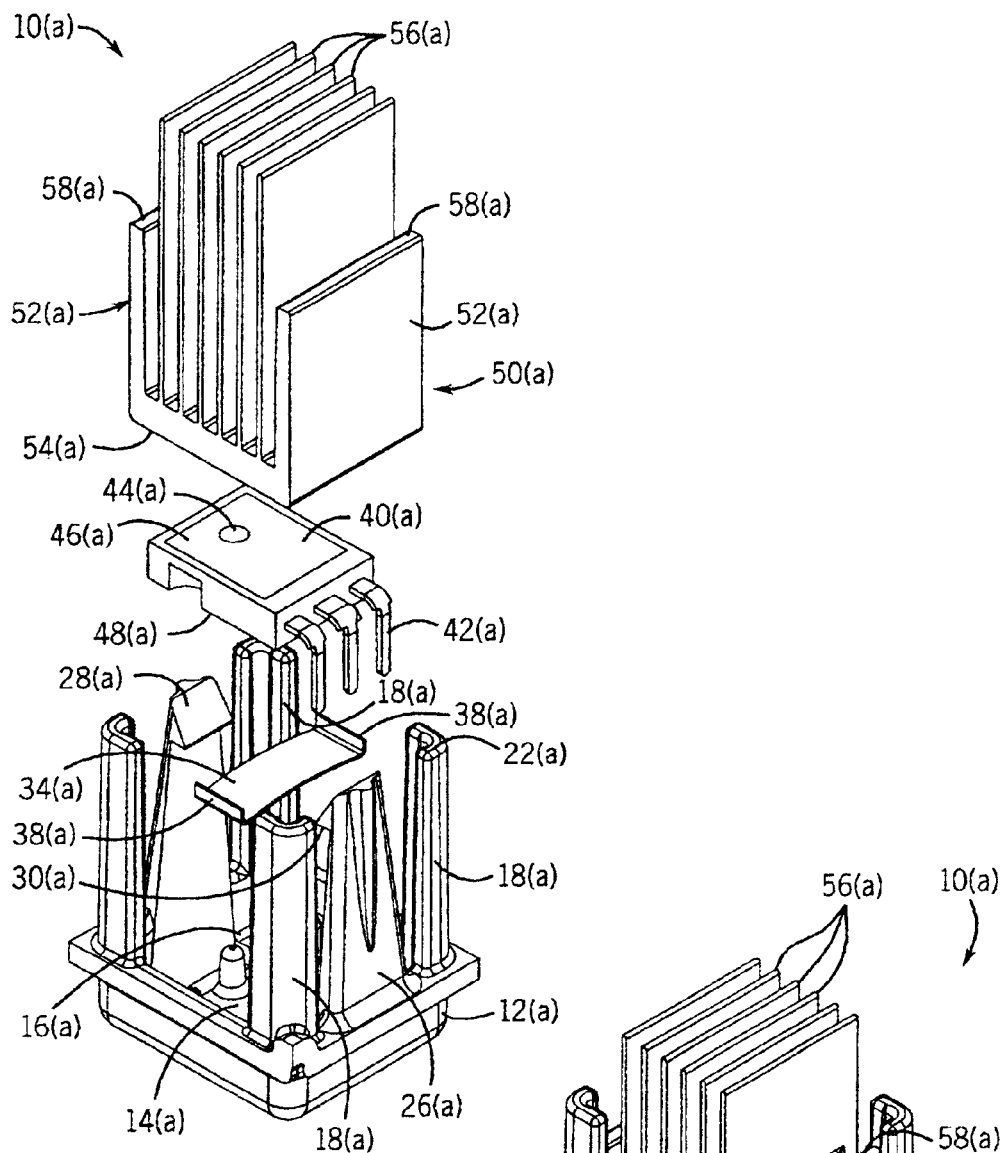
FIG. 6 is an exploded view of a heat sink assembly constructed in accordance with another embodiment of the present invention.

Referring now to FIG. 6, there is shown an exploded view of a heat sink assembly 10 constructed in accordance with another embodiment of the present invention. As can be seen, the heat sink assembly 10(a) is similar to the heat sink assembly of FIG. 1 and includes a frame 12(a) having a generally planar upper surface 14(a) and having downwardly displaced bottom surface 16(a) that is formed in the frame 12(a). Extending upwardly from surface 14(a) are guides 18(a).

The heat sink assembly 10(a) includes four guides 18(a) which define a space therebetween. Guides 18(a) are located at each corner of the rectangular space. Each of the guides 18(a) is preferably shaped so as to have free ends 22(a) and an inner surface that is tapered inwardly in the direction toward the bottom surface 16(a). That is, the rectangular space narrows in the direction towards the bottom surface 16(a) so that a rectangular object placed into the space will pass along a narrowing space and be fully guided to its ultimate location at the inner ends of the guides 18(a).

Also extending outwardly with respect to the bottom surface 16(a) are a plurality of spring members 26(a) that are configured so as to have a generally downwardly and inwardly sloping free end 28(a) leading to an inwardly directed projection 30(a) formed therein. There are two of such spring members 26. However, more spring members could be used as the width of the heat sink increases.

Additionally, the frame 12(a) includes a number of features, and may also include an indexing protrusion that extends outwardly from the bottom surface 16(a) as well as various spring guides that are also formed in the bottom surface 16(a). A spring 34(a) is provided and has a generally upwardly curved surface and has upturned outer ends 38(a). The spring 34(a) is preferably constructed of a metal, such as stainless steel, and has dimensions and configuration designed so as to provide a predetermined upward springing action when its upper surface is compressed. In the assembly of the present heat sink assembly 10(a), the spring 34(a) is placed onto the bottom surface 16(a) of the frame 12(a) and is guided into the desired position on that bottom surface 16(a) by means of the spring guides.

Similar to the heat sink assembly of FIG. 1, heat sink assembly 10(a) includes an electronic component 40(a) which may be any of a number of typical heat generating electronic devices such as diodes, IGBTS, resistors, and the like. The electronic component 40(a) has a plurality of conductive leads 42(a) that extend outwardly and downwardly toward the frame 12(a). The electronic component 40 also has an opening 44 that mates with an indexing protrusion formed in the bottom surface 16(a) of the frame 12(a) to guide the electronic component into the desired location within the frame 12. Electronic component 40(a) has a flat upper surface 46(a) and a lower surface 48(a).

Finally, a heat sink 50(a) is provided and which is preferably formed of a metal and, in the preferred embodiment, is extruded of aluminum. The heat sink 50(a) has lateral external surfaces 52(a), oppositely disposed, a lower planar surface 54(a) and a plurality of heat radiating fins 56(a). As can be seen the heat radiating fins 56(a) are elongated or oriented along an axis which is basically determined by the extrusion process itself and the external lateral surfaces 52(a) are generally elongated along that same orientation. Each lateral surface 52(a) includes an upper end defined by a ridge 58(a). The ridge 58(a) defines the top surface or edge of lateral surface 52(a) such that surface 52(a) has a height of approximately half of fins 56(a).

Figure 7:
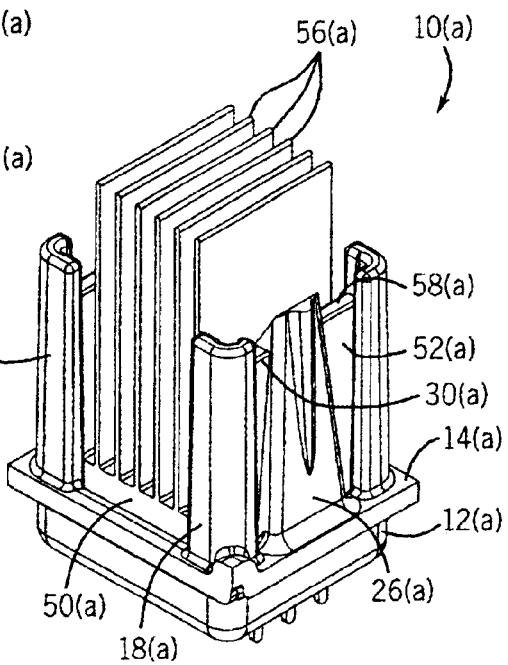
FIG. 7 is a perspective view of the heat sink assembly of FIG. 6.

Turning now to FIG. 7, there is shown a perspective view of the heat sink assembly 10(a) with the heat sink 50(a) affixed to the frame 12(a) and, as can be seen, the heat sink 50(a) has become centered within the guides 18(a) so that it is fitted into the correct position atop of the frame 12(a). As assembled, spring member 26(a) has become snap fitted due to the relative flexible nature of the spring member 26(a) so that the heat sink 50(a) is tightly held to the frame 12(a). As also can be seen, the heat radiating fins 56(a) are all aligned in a generally parallel relationship and which is due to the extrusion process used to manufacture the heat sink 50(a).

Figure 8:
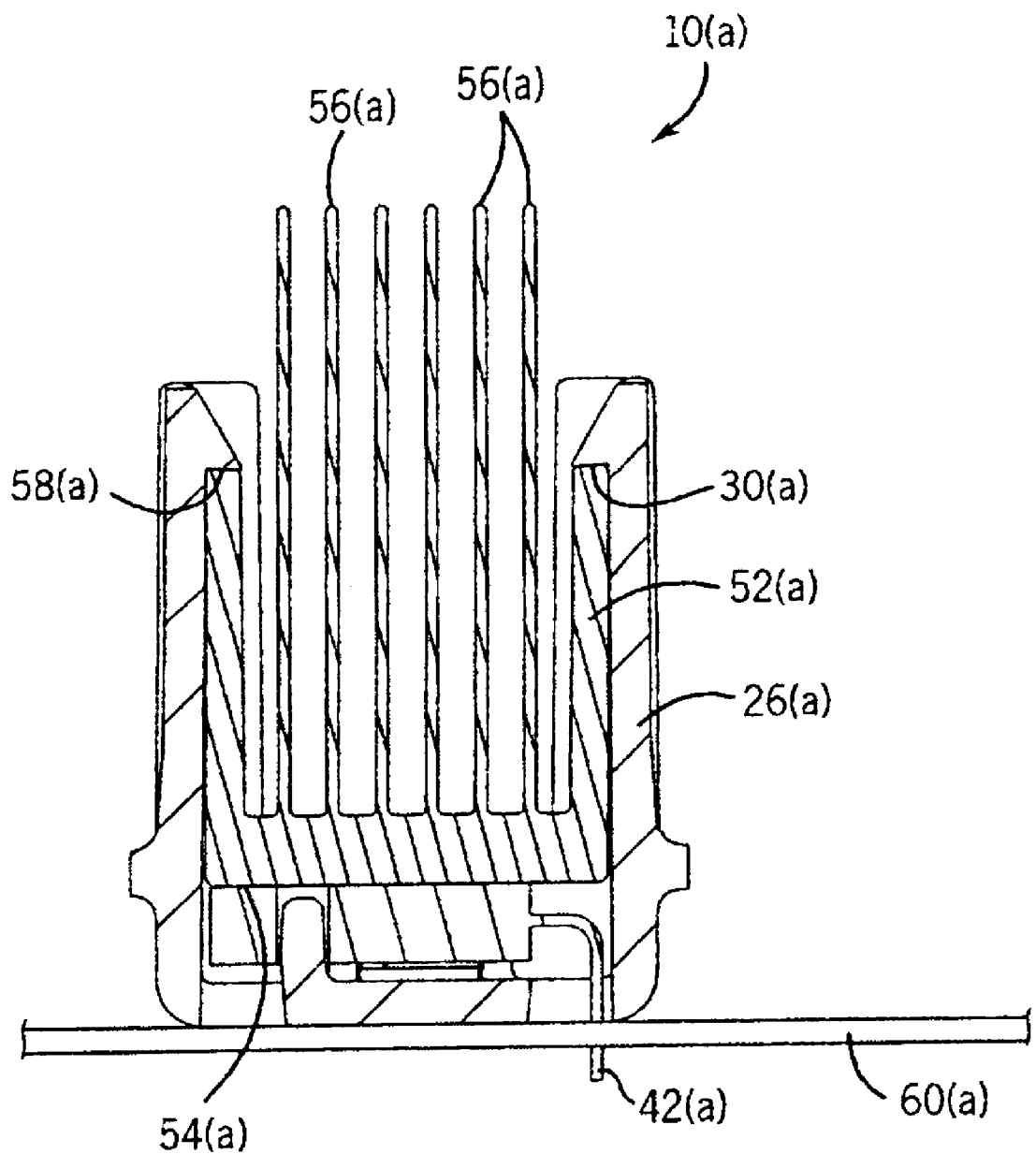
FIG. 8 is a side view of the heat sink assembly of FIG. 6.

Turning now to FIG. 8, there is shown a side view of the heat sink assembly 10(a), that is, taken along the extruded direction. In FIG. 8, the frame 12(a) is affixed to a PC board 60(a) and the conductive leads 42(a) extend downwardly to be connected to the PC board 60(a) by means such as wave soldering. FIG. 8 also illustrates the interconnection of the inwardly directed projections 30(a) formed at the free ends of the spring members 26(a) tightly positioned over the elongated ridges 58(a) to hold the heat sink 50(a) fast to the frame 12(a).

Those skilled in the art will readily recognize numerous adaptations and modifications which can be made to the heat sink assembly and method of assembling the same of the present invention which will result in an improved process and apparatus, yet all of which will fall within the scope and spirit of the present invention as defined in the following claims. Accordingly, the invention is to be limited only by the following claims and their equivalents.

What is claimed is:

1. A heat sink assembly, said assembly comprising:
   a frame comprising a bottom surface, the frame having a plurality of spring members extending upwardly from said bottom surface, the plurality of spring members having free ends configured with projections thereon;
   an electronic component fitted within the spring members and located against the bottom surface of the frame;
   a heat sink having a generally planar surface in contact with the electronic component and having a plurality of heat radiating fins extending outwardly from the planar surface, the heat sink having at least one elongated ridge formed along at least two oppositely disposed exterior surfaces thereof;
   the heat sink retained in a fixed position with respect to the frame by means of the plurality of spring members snap fitted about the elongated ridge; and
   a spring located intermediate the frame and the electronic component, the spring adapted to create a predetermined bias to force the electronic component outwardly against the generally planar surface of the heat sink.

2. The heat sink assembly of claim 1 wherein the frame further has a plurality of guides extending outwardly therefrom and wherein the at least one elongated ridge is defined by a groove cut into an exterior surface.

3. The heat sink assembly of claim 1 wherein the heat sink is extruded metal.

4. The heat sink assembly of claim 1 wherein the heat sink is extruded aluminum.

5. The heat sink assembly of claim 1 wherein the plurality of guides comprises four guides forming a rectangular space.

6. The heat sink assembly of claim 1 wherein the electronic component has a opening therethrough and the base includes a pin extending outwardly from the base to enter the opening to guide the electronic component into the desired position.

7. The heat sink assembly of claim 1 wherein the base including the guides and the plurality of spring members are a one piece injection molded plastic construction.

8. The heat sink assembly of claim 1 wherein the heat sink includes a PC board affixed to the frame opposite the heat sink and the conductive leads of said electronic component pass through the frame to be connected to the PC board.

9. The heat sink assembly of claim 1 wherein the spring is centrally arched upwardly to contact the electronic component at the upward arch.

10. The heat sink assembly of claim 9 wherein the spring is constructed of one of steel and brass.

11. The heat sink assembly of claim 10 wherein the steel includes one of stainless steel and carbon steel.

12. The heat sink assembly of claim 1 wherein the frame further includes spring guides extending upwardly from the bottom surface of the frame to locate the spring in a predetermined location.

13. The heat sink assembly of claim 1 wherein the electronic component has a plurality of conductive leads that pass through the bottom surface of the frame.

14. A multiple heat sink assembly, said assembly comprising:

a multiple frame having a plurality of individual sites, each site having a bottom surface and a plurality of spring members extending upwardly from said bottom surface, the plurality of spring members having free ends configured with projections thereon;

an electronic component fitted within the spring members and located against the bottom surface;

a heat sink having a generally planar surface in contact with the electronic component and having a plurality of heat radiating fins extending outwardly from the planar surface, the heat sink having at least one elongated ridge formed along at least two oppositely disposed exterior surfaces thereof;

the heat sink retained in a fixed position with respect to the frame by means of the plurality of spring members snap-fittingly engaged about the elongated ridges; and a spring located intermediate the frame and the electronic component, the spring adapted to create a predetermined bias to force the electronic component outwardly against the generally planar surface of the heat sink.

15. The multiple heat sink of claim 14 wherein the frame further includes guides extending outwardly from the bottom surface of the frame and wherein the at least one elongated ridge is defined by a groove cut into an exterior surface.

16. The multiple heat sink assembly of claim 14 wherein the individual sites are aligned in parallel rows of sites.

17. The multiple heat sink assembly of claim 16 wherein the individual sites of any row are displaced laterally away from the sites formed in an adjoining row.

18. A method of assembling a heat sink to contact an electronic component, said method comprising the steps of:

providing a frame having a plurality of outwardly extending spring members having protrusions at the free ends thereon;

providing a heat sink having lateral sides, each lateral side having an upper end defined by an elongated ridge;

positioning a spring having a outer surface in the frame in a predetermined location;

positioning an electronic component against the outer surface of the spring; and inserting the heat sink between the outwardly extending spring members to cause the protrusion to snap fit over the ridges in the heat sink to affix the heat sink to the frame in a position where the spring is compressed to create a force between the electronic component and the heat sink.

19. The method of claim 18 wherein the step of providing a frame comprises providing a frame having a plurality of guides extending outwardly.

20. The method of claim 18 wherein the step of providing a frame comprises providing a frame having an outwardly extending indexing projection and said step of positioning an electronic component comprises using the indexing projection to locate the electronic component in a predetermined position.

21. The method of claim 18 wherein the step of providing a frame comprises providing a frame having a plurality of outwardly extending spring guides and said step of positioning a spring comprises using the spring guides to locate the spring in a predetermined position.

* * * * *